US 9,852,245 B2

United States Patent
Kusko et al.

(10) Patent No.: US 9,852,245 B2
(45) Date of Patent: Dec. 26, 2017

(54) DYNAMIC FAULT MODEL GENERATION FOR DIAGNOSTICS SIMULATION AND PATTERN GENERATION

(71) Applicant: International Business Machines Corporation, Armonk, NY (US)

(72) Inventors: Mary P. Kusko, Hopewell Junction, NY (US); Gary W. Maier, Poughkeepsie, NY (US); Franco Motika, Hopewell Junction, NY (US); Phong T. Tran, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/398,106

(22) Filed: Jan. 4, 2017

(65) Prior Publication Data
US 2017/0199946 A1    Jul. 13, 2017

Related U.S. Application Data

(63) Continuation of application No. 14/994,188, filed on Jan. 13, 2016, now Pat. No. 9,552,449.

(51) Int. Cl.
*G06F 17/00* (2006.01)
*G06F 17/50* (2006.01)

(52) U.S. Cl.
CPC ........ *G06F 17/504* (2013.01); *G06F 17/5036* (2013.01)

(58) Field of Classification Search
USPC ........................................................ 716/112
See application file for complete search history.

(56) References Cited

U.S. PATENT DOCUMENTS

| | | | |
|---|---|---|---|
| 9,552,449 B1 * | 1/2017 | Kusko | G01R 31/318342 |
| 2002/0155628 A1 * | 10/2002 | Bulaga | H01L 22/20 |
| | | | 438/14 |
| 2004/0236531 A1 * | 11/2004 | Madge | G01R 31/01 |
| | | | 702/118 |

OTHER PUBLICATIONS

List of IBM Patents or Patent Applications Treated as Related; (Appendix P), Filed Aug. 23, 2017; 2 pages.

(Continued)

*Primary Examiner* — Mohammed Alam
(74) *Attorney, Agent, or Firm* — Cantor Colburn LLP; Steven Meyers

(57) ABSTRACT

Techniques relate to dynamic complex fault model generation for diagnostics simulation and pattern generation. Inline fabrication parametric data is received, and the inline fabrication parametric data is a collection of physical measurements made on a device under test during a manufacturing fabrication of the device under test. A fault model of defects is generated according to the inline fabrication parametric data, where the fault model is based on a physical design of the device under test combined with the inline fabrication parametric data for the device under test. Test patterns are generated based on the fault model and the inline fabrication parametric data, such that the test patterns are configured to test the device under test in order to obtain results that are based on the inline fabrication parametric data. A simulation is run of the device under test using the results and the inline fabrication parametric data.

20 Claims, 9 Drawing Sheets

(56) References Cited

OTHER PUBLICATIONS

Mary P. Kusko et al."Dynamic Fault Model Generation for Diagnostics Simulation and Pattern Generation", U.S. Appl. No. 14/994,188, filed Jan. 13, 2016, U.S. Pat. No. 9,552,449, Jan. 24, 2017.

\* cited by examiner

600

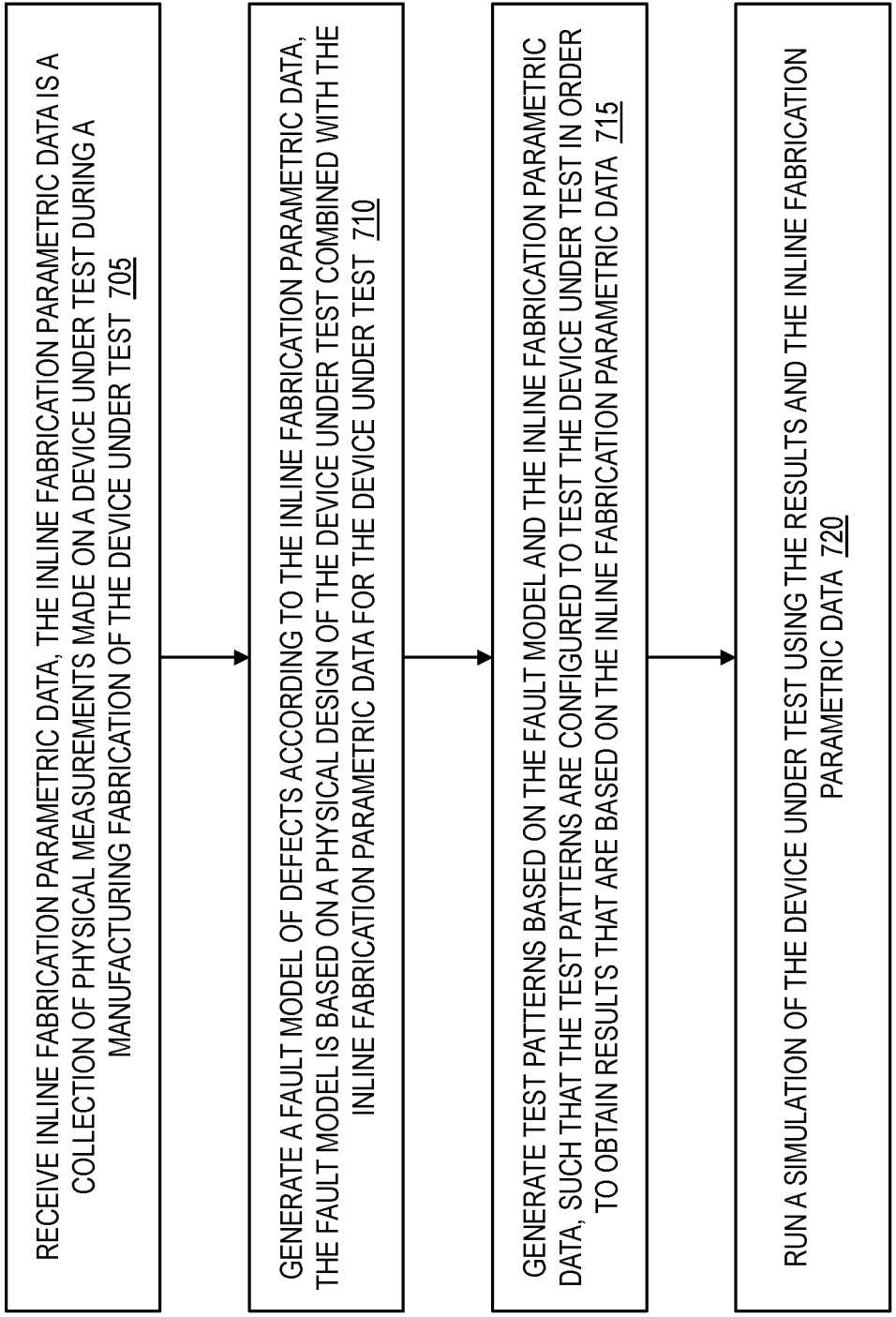

DYNAMIC FAULT MODEL GENERATION FOR DIAGNOSTICS SIMULATION AND PATTERN GENERATION

PRIORITY

This application is a continuation of U.S. Non-Provisional application Ser. No. 14/994,188, entitled "DYNAMIC FAULT MODEL GENERATION FOR DIAGNOSTICS SIMULATION AND PATTERN GENERATION", filed Jan. 13, 2016, the contents of which are incorporated herein by reference in their entirety.

BACKGROUND

The present invention relates generally to testing integrated circuits, and more specifically, to dynamic fault model generation for diagnostics simulation and pattern generation.

The fault model is an engineering model of defects that occur in the fabrication of an integrated circuit, such as a microprocessor having numerous interconnected logic circuits. It is appreciated that many types of defects may be modeled in the fault model. Basic fault models in digital circuits may include the following. 1) The stuck-at fault model. A signal, or gate output, is stuck at a 0 or 1 value, independent of the inputs to the circuit. 2) The bridging fault model. Two signals are connected together when they should not be. Depending on the logic circuitry employed, this may result in a wired-OR or wired-AND logic function. 3) Transistor faults. This model is used to describe faults for complementary metal-oxide-semiconductor (CMOS) logic gates. At transistor level, a transistor may be stuck-short or stuck-open. In stuck-short, a transistor behaves as it is always conducts (or stuck-on), and stuck-open is when a transistor never conducts current (or stuck-off). Stuck-short will produce a short between VDD (positive supply voltage) and VSS (negative supply voltage or ground). 4) The open fault model. Here a wire is assumed broken, and one or more inputs are disconnected from the output that should drive them. As with bridging faults, the resulting behavior depends on the circuit implementation. 5) The delay fault model, also referred to as slow-to-rise or slow-to-fall transition faults, where the signal eventually assumes the correct value, but more slowly (or rarely, more quickly) than normal. 6) The cross-coupling ac faults, where signal nets that are in close proximity interfere with each other. The above enumerated modeled fault types are typically used during fault simulation, test generation, and diagnostics. In addition to the above modeled faults, there are many types of un-modeled faults that are to be considered for an effective dynamic fault model generation for diagnostics and pattern generation.

SUMMARY

Embodiments include a method, system, and computer program product for dynamic complex fault model generation for diagnostics simulation and pattern generation. Inline fabrication parametric data is received, and the inline fabrication parametric data is a collection of physical measurements made on a device under test during a manufacturing fabrication of the device under test. A fault model of defects is generated according to the inline fabrication parametric data, where the fault model is based on a physical design of the device under test combined with the inline fabrication parametric data for the device under test. Test patterns are generated based on the fault model and the inline fabrication parametric data, such that the test patterns are configured to test the device under test in order to obtain results that are based on the inline fabrication parametric data. A simulation is run of the device under test using the results and the inline fabrication parametric data.

BRIEF DESCRIPTION OF THE DRAWINGS

FIG. 7 is a flow chart of a computer implemented method for dynamic complex fault model generation for diagnostics simulation and pattern generation in accordance with an embodiment.

DETAILED DESCRIPTION

Figure 1:
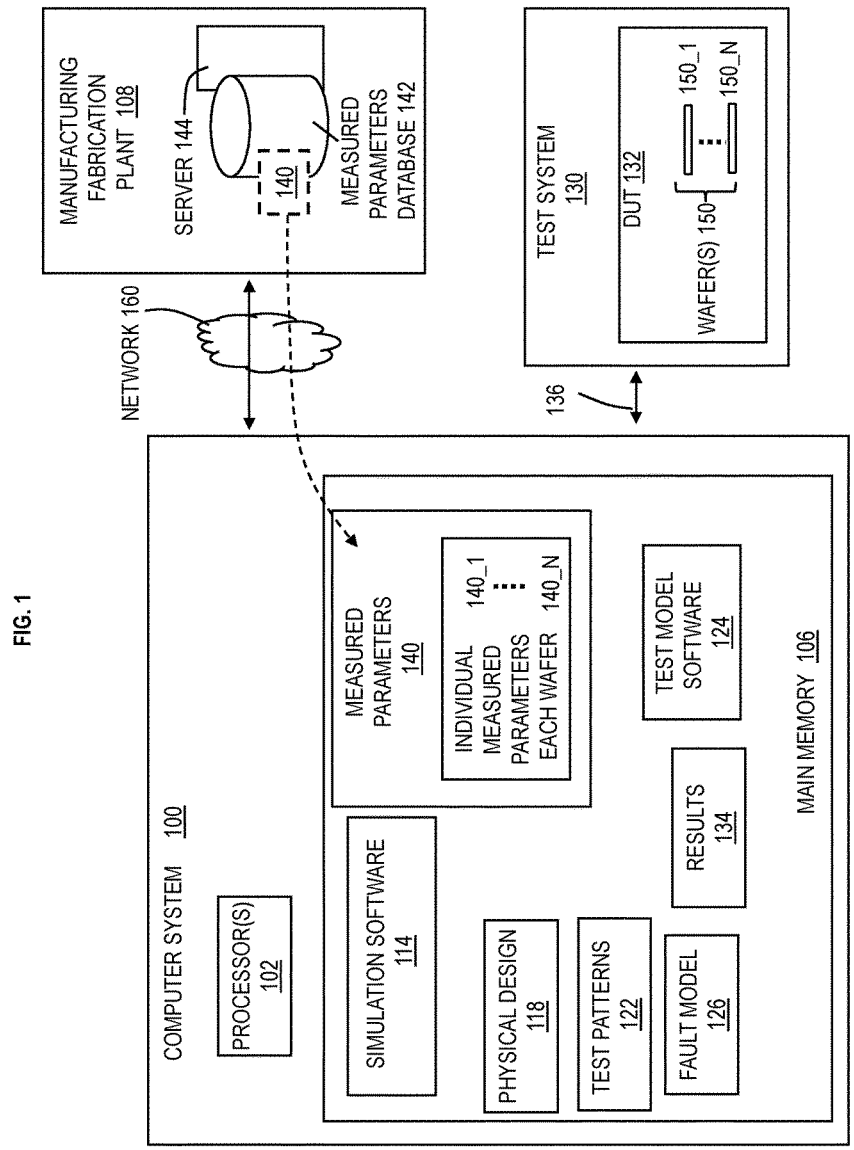
FIG. 1 depicts a computer system in accordance with an embodiment.

Design complexity, along with circuit and wiring density, is continuing to rise. In addition, much smaller process windows are evolving due to continued shrinking geometries, spacing, and material critical dimensions (CD). Complex and non-visible defects are a much bigger part of the total sum of device and chip integration parasitics that drive the performance, power, form, and function of deep sub-micron (DSM) designs. This design sensitivity to the process is growing rapidly.

This creates a problem in localization and failure analysis (FA) and creates rising no-defect-found (NDF) results. Diagnostics and FA resources are very expensive which drives higher cost of yield (COY) to the manufacturing fabrication (FAB), and ultimately the customer. To address the FA cost and COY problem, embodiments provide a novel way to create a dynamic complex fault model that simulates the way faults behave by varying process parameters to improve the localization fails and decrease the NDF results in FA.

Embodiments disclose a diagnostic method based on a complex set of faults. These complex set of faults are derived and generated from product design data and multiple real time process parameters. This unique diagnostic methodology in conjunction with the complex set of faults enhances defect localization and reduces NDF occurrences.

An embodiment adds a parametric preprocessor and product design database to be used for product diagnostics simulations. This database is built ahead of final test during the manufacture of each wafer for each product and technology. This database also includes the full 6 sigma process window for each parameter in each technology. During product pattern generation, the automated test pattern generation (ATPG) tool constructs a set of faults and generates a set of patterns to detect those faults. Embodiments add a new list of complex faults that use real process parametric data and design information that can later change the way complex faults behave. This may include items like varying wiring and dielectric critical dimensions that can affect line inductance, capacitance, and resistance (LCR) that were predicted during design extractions and device parameters like effective channel length (Leff) design extractions versus the actual process Leff.

The preprocessor then builds a new set of complex faults using each product's design data and the real time process parameters for each wafer to adjust items, such as resistance, capacitance, inductance, and parameters that create device proximity effects and other device parameters. New patterns are then generated using circuit modified aggressor and victim behavior not previously considered. Defective parts can then be sensitized differently under varying design, test, and environmental conditions. Fault and diagnostics grading is then improved to narrow a set of targeted patterns and a reduced generated list of potential diagnosed candidates. This improves localization and reduces expensive failure analysis time and resources to find root cause, which ultimately lowers COY.

Figure 2:
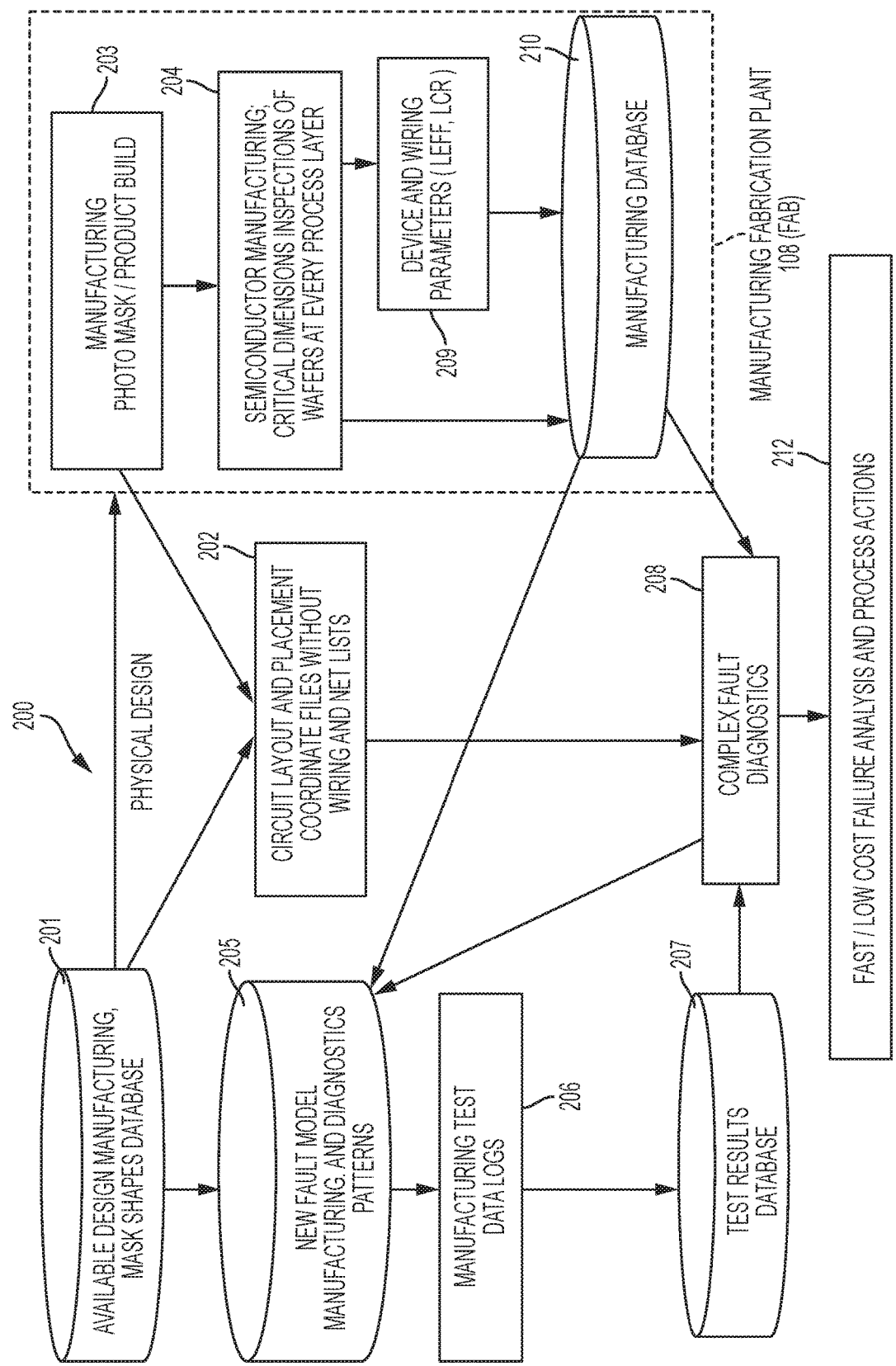
FIG. 2 is a flow chart of a complex diagnostic fault model generation process in accordance with an embodiment.

Turning now to FIG. 1, a computer system 100 is generally shown according to an embodiment. Computer system 100 includes a processor 102 (or preprocessor) that is in communication with a main memory 106. The processor 102 executes applications such as a simulation software 114 and test model software 124 that are stored in main memory 106 by processing instructions. FIG. 2 is a flow chart 200 of a complex diagnostic fault model generation process according to an embodiment. The computer system 100 in FIG. 1 may be utilized in complex diagnostic fault model generation process in FIG. 2.

Referring to FIGS. 1 and 2, at block 201, there is a completed physical design 118 for an integrated circuit (IC) (e.g., a chip) on the wafer 150, and the physical design 118 may be in a manufacturing mask shapes database.

The physical design 118 is released to the manufacturing fabrication (Fab) plant 108 in block 203. At block 203, the manufacturing fabrication plant 108 builds the photo mask from the physical design 118, and then builds the actual product using the photo mask. The product is the integrated circuit on a wafer according to the physical design 118. There may be numerous integrated circuits on a wafer, and each integrated circuit may be diced into an individual chip. In parallel to releasing this physical design 118 to the manufacturing fabrication plant 108, a test model 124 is created from the design (VHDL) logic libraries of the physical design 118 in block 205.

This test model 124 is the logical equivalent model that is used to generate test patterns 122 to test the entire physical design 118. Once the test model 124 is built to replicate the physical design 118, a list of faults for a fault model 126 is generated which includes all of the gate inputs and outputs used in the physical design 118. Example gates include AND, NAND, OR, NOR, etc. Direct current faults are targeted first, such as stuck at 0 or stuck at 1 on the inputs or outputs to a gate or a wire connected to the gate.

Items like wires, called nets, can be shorted to other nets, or the wires can be open. More complex faults are also modeled in the fault model 126 such as resistive shorts to other nets. These types of faults may not behave like a dead short causing a stuck at 1 or 0. Instead, resistive shorts may only behave as a short under certain environmental or test conditions, such as high temperature and high voltage where the resistive short becomes less resistive and then gets stuck at 0 or 1 intermittently.

In addition, the transistors that make up the gates on the integrated circuit may be designed with different drive strengths. The wires that connect these gates can also be designed with different lengths and widths. When the devices and wires are manufactured by the manufacturing fabrication plant 108, the devices may end up with larger or smaller drive strengths which are different from the physical design's (118) intent. So, the ability of a device to drive a 0 or 1 may change or be delayed. This can affect a net's tolerance to these complex faults.

The wires can also end up being manufactured with slightly different widths which affect their Inductance (L), Capacitance (C), and Resistance (R). This combination of LCR can affect how long it takes to drive a 1 transition for a gate which can also act like a very complex fault that is hard to detect. In addition to the RLC parameters, the capacitive cross coupling and mutual inductance coupling can further compound these faults making detection and diagnosis even more difficult.

The test model 124 can create complex faults (in the fault model 126) that can be modeled using a range of devices sizes and drive strengths along with a range of wiring LCR values within the FAB quoted sigma of the actual shapes. The physical design 118 in block 201 can also provide the LCR extractions for all nets on the physical design 118 which can be used to generate a large list of possible complex faults in the fault model 126. In the state-of-the art, the problem with this process is the test model size becomes very large and the simulations become astronomically long to create all the combinations of possible complex faults in the state-of-the-art. In addition, in the state-of the-art, the sheer volume of test patterns 122 generated at block 205 is too large and nearly impossible to run in final test block 206. The final test is the physical test (performed by a test system 130) of the product such as the integrated circuit on wafer 150 which is the actual device under test (DUT) 132, and test patterns 122 are run by the test system 130 in attempt to cause a fail according to the fault model 126. The fails are collected as fail data test results 134.

Further, by having the sheer volume of test patterns 122 too large and nearly impossible to run in final test block 206, this affects simulations during pattern generation as well as the diagnostics simulations (by the simulation software 114) at block 208 when simulating fail data test results 134 retrieved from final test of the product (at block 207) which also makes it unaffordable and impractical in the state-of-the-art. Also, during complex fault diagnostics at block 208, the simulation receives circuit layout and placement coordinate files without wiring and net lists from block 202.

However, embodiments provide a solution that uses the actual data collected (inline fabrication parametric data) in the blocks 204, 209, and 210 in the manufacturing fabrication plant 108. As the manufacturing fabrication plant 108 builds a physical design 118 into an integrated circuit on wafer 150, manufacturing fabrication plant 108 measures parameters 140 (at every process layer) of the integrated circuit that has been built in the plant 108 at block 204 and stores the measured parameters 140 in database 142 at block 210. At block 209, the manufacturing fabrication plant 108 measures LCR of the wires and insulators (called dielectrics). Also, at block 209, the manufacturing fabrication plant 108 measures the L effective (Leff) of the device which is a parameter that is a combination of the device length, width, gate insulator (called Tox (oxide thickness)), and implants (i.e., dopants) that changes the voltage threshold (VT). All of these measured parameters 140 affect the device drive strength or the device's ability and speed to drive a 1 to 0 value or 0 to 1 value on the nets. These varying design parameters, combined with missed subtle or invisible defects the FAB plant 108 does not detect, later exhibit very complex fail behavior that is hard to detect at final test or isolate for failure analysis in block 212. This can result in shipping a bad product or expensive methods to find and fix defect in the state-of-the-art. Every product design is measured this way to guarantee the device is defect free and performs to the product specifications. However, embodiments use the measured parameters 140 to detect as faults and locate the subtle or invisible defects that the FAB plant 108 does not detect. Therefore, embodiments are configured to detect and locate (find) these very complex fail behavior.

These measurements 140 are stored in a FAB database 142 at block 210. Embodiments use the dynamic FAB (data) measurements 140 during the test model build (of the test model 124) and pattern generation (of the test patterns 122) that is running in parallel to the design build of the integrated circuit on the wafer 150 in the FAB plant 108. In one implementation, the computing system 100 collects over network 160 the measurement data 140 in real time for every wafer 150 (such as individual measurements 140_1 through 140_N in a one-to-one fashion for each wafer 150_1 through 150_N when measured at blocks 204 and 209 by the manufacturing fabrication plant 108) and product chip that is built. This allows the use of a dynamic complex fault list 305 to be built and complex fault patterns 310 simulated with a single targeted set of the actual parameter values 140 (i.e., measurements 140_1 used for testing wafer 150_1, measurements 140_1 used for testing wafer 150_2, through measurements 140_N used for testing wafer 150_N) in embodiments, as opposed to having to generate a whole range of expected values as required in the state-of-the-art. For example, the state-of-the-art fault models use a range of expected values taken from wire modeled inductance (L), capacitance (C), resistance (R) by wire length, as shown in graphs 405, 410, 415 respectively in FIGS. 4A, 4B, and 4C.

In contrast, use of the actual measured parameters 140 that were measured on the respective wafer 150 (by the manufacturing fabrication plant 108) provides an effective and highly productive method to dynamically build test patterns 122 for new scaled designs according to embodiments.

Figure 3:
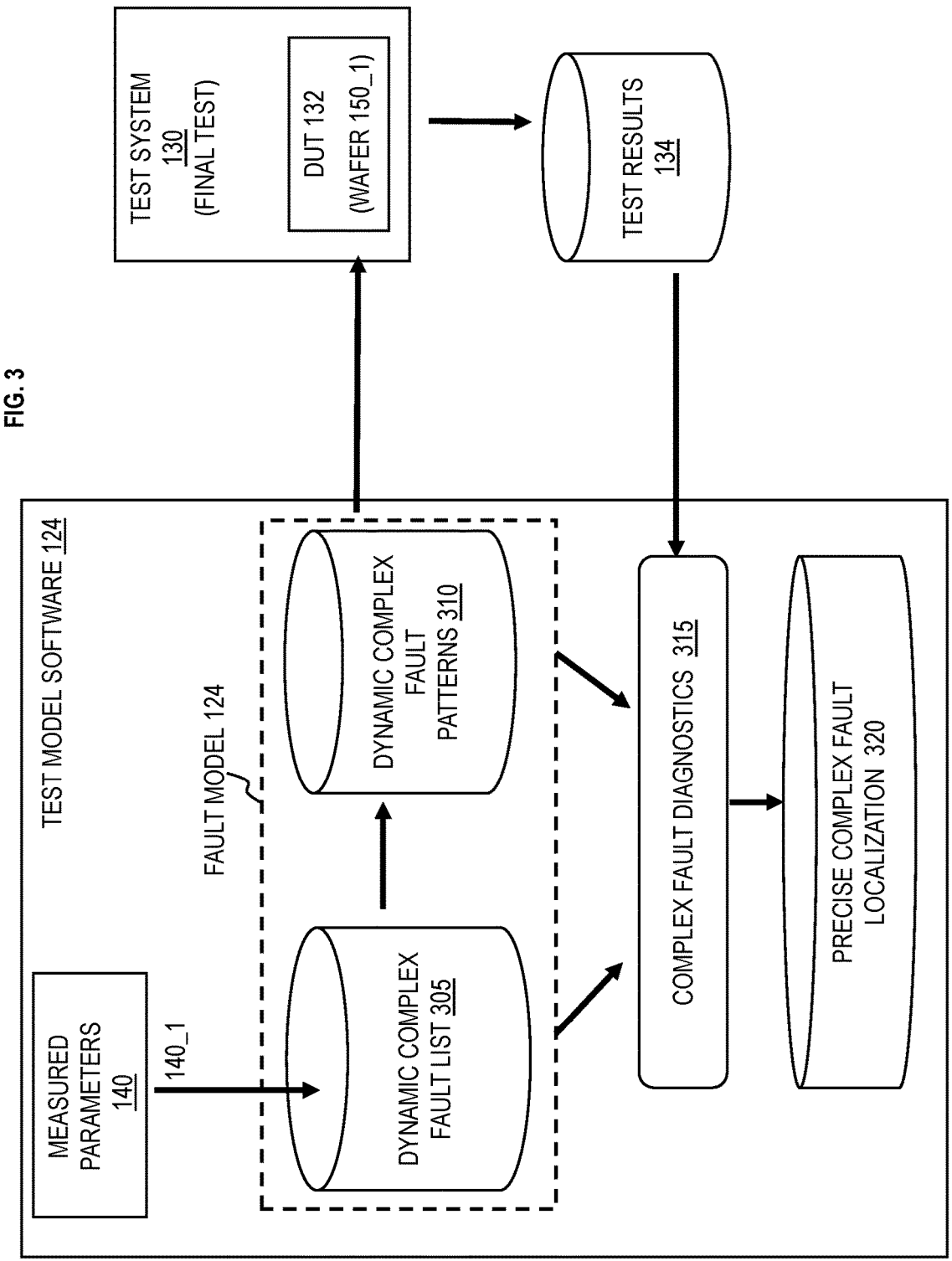
FIG. 3 illustrates details of test model software in accordance with an embodiment.

FIG. 3 illustrates further details of the test model software 124 according to an embodiment. In one implementation, the test model software 124 may include the fault model 124. In another implementation, the test model software 124 may execute in conjunction with the fault model 124. An example is provided with respect to wafer 150_1 and its measured parameters 140_1 for ease of understanding, but it should be appreciated that the example applies by analogy to the remaining wafers 150_2 through 150_N and their respective measured parameters 140_1 through 140_N. Each wafer 150_1 through 150_N is built by the manufacturing fabrication plant 108 and is individually measured to obtain its own measured parameters 140_1 through 140_N.

In FIG. 3, the test model software 124 receives the measured parameters 140_1 measured on processed layers of the wafer 150_1 from the manufacturing fabrication plant 108 in parallel to building the wafer 150_1. As the integrated circuit of the wafer 150_1 is continuously being built, the test model software 124 is configured to generate the dynamic complex fault list 305 (for wafer 150_1) using the actual measured parameters 140_1 (for wafer 150_1). The test model software 124 utilizes the dynamic complex fault list 305 to generate the dynamic complex fault patterns 310. The dynamic complex fault patterns 310 may be the same as the test patterns 122 in one implementation. In another implementation, the complex fault patterns 310 may be in addition to the test patterns 122, such that each wafer (has generated from its inline measured parameters) a unique set of complex fault patterns 310 that can be run on that wafer at final test. Using the fault model 126 (that is based on values of the actual measured parameters 140_1 measured for wafer 150_1), the test model software 124 generates test patterns 122 to run on the test system 130 for testing the device under test 132. In this example, the device under test 132 is the wafer 150_1. The final test (at block 206) is run on the wafer 150_1 by the test system 130 and the test results 134 are provided to the simulation software 114. Using the test results 134 from the test system 130, the simulation software 114 performs complex fault diagnostics 315 (based on the actual measured parameters 140_1 measured for wafer 150_1) to determine where the faults in the wafer 150_1 are located. The location information of faults found on wafer 150_1 is stored in precise complex fault localization database 320 to be passed to physical failure analysis (PFA). During physical failure analysis, the integrated circuit on the wafer 150_1 is taken apart layer by layer to identify the location of the faults according to the fault location information from the precise complex fault localization database 320.

It is noted that the wire parameters (e.g., in the measured parameters 140) are LCR. These measurements may not be made for every wire in the design. The kerf wiring macros adjacent to every product chip are measured which is representative of each chip on the wafer. LCR does not vary by wire but can vary cross wafer or by wafer for each wiring level.

It is further noted that the LCR values are varied for each wiring level. The design "extracted values" or "targeted or expected values" are then replaced by the "real measured values" to create the actual complex fault (in the dynamic complex fault patterns 310), and the real measured values affect the circuit differently from a guessed targeted set of values. In embodiments, the benefits include better fault detection and higher quality product, more accurate and less expensive localization to reduce COY, and the ability to actually create a limited much smaller set of more accurate patterns to be run at final test. The state-of-the-art method takes too long and creates far too many patterns to be a viable and useable solution. The state-of-the-art is too costly for the test to run all patterns, and the patterns may not behave as the measured parameters would; thus a defective product can escape detection and be passed to the customer. COY is also much higher as NDF is high in the state-of-the-art.

Figure 5:
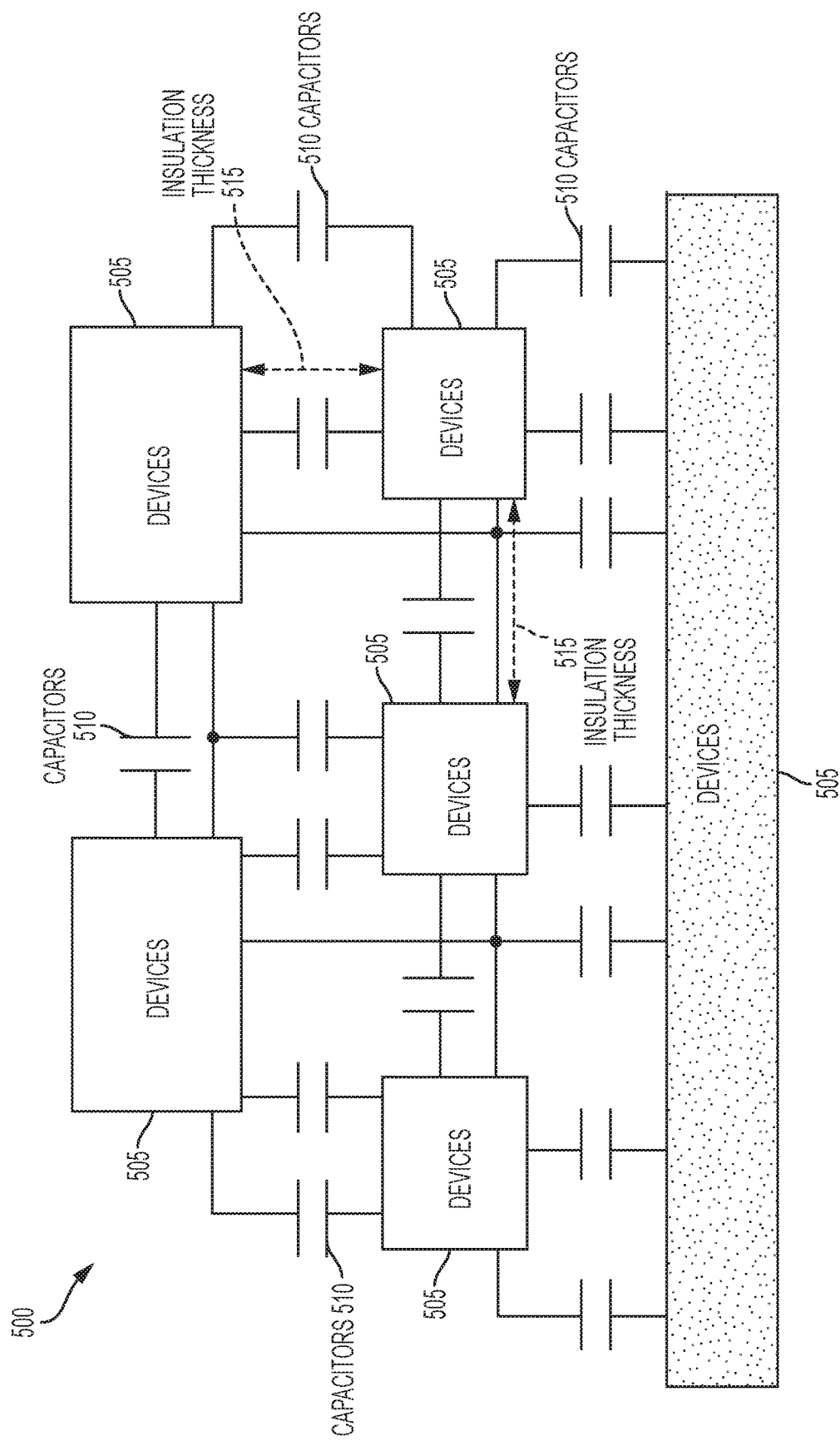
FIG. 5 depicts dielectric thickness and wiring capacitance measured on every wafer and stored measured parameters for building a dynamic complex fault model in accordance with an embodiment.

FIG. 5 depicts insulating layer dielectric thickness critical dimensions (CD) and wiring capacitance measured on every wafer 150 and stored measured parameters 140 for use in building the dynamic complex fault model 126 according to an embodiment. As noted herein for explanation purposes, an example is provided with respect to wafer 150_1 and its measured parameters 140_1, but the explanation applies by analogy to the remaining wafers 150_2 thorough 150_N and their respective measured parameters 140_1 through 140_N.

FIG. 5 depicts an example portion 500 of the integrated circuit of one of the wafers 150, e.g., wafer 150_1 according to an embodiment. As part of the measured parameters 140_1 for the corresponding wafer 150_1, the manufacturing fabrication plant 108 measures the capacitance, represented by capacitors 510, of wires connecting devices 505 (e.g., logic gates, transistors, etc.), and these measurements comprise the measured parameters 140_1 (i.e., actual values) for the wafer 150_1. Similarly, the manufacturing fabrication plant 108 measures the insulating layer dielectric thickness 515 (e.g., of an oxide material) between each of the devices 505, and these measurements comprise the measured parameters 140_1 (i.e., actual values) for the wafer 150_1. It should be appreciated that only a few example parameters are discussed and each of the inline fabrication parameters are measured for wafer 150_1 and stored in the measured parameters 140_1.

In the measured parameters 140_1, these actual values are utilized in the fault model 126 to then test the same measured wafer 150_1 for defects, when the measured wafer 150_1 is placed in the test system 130 as the device under test 132.

Figure 6:
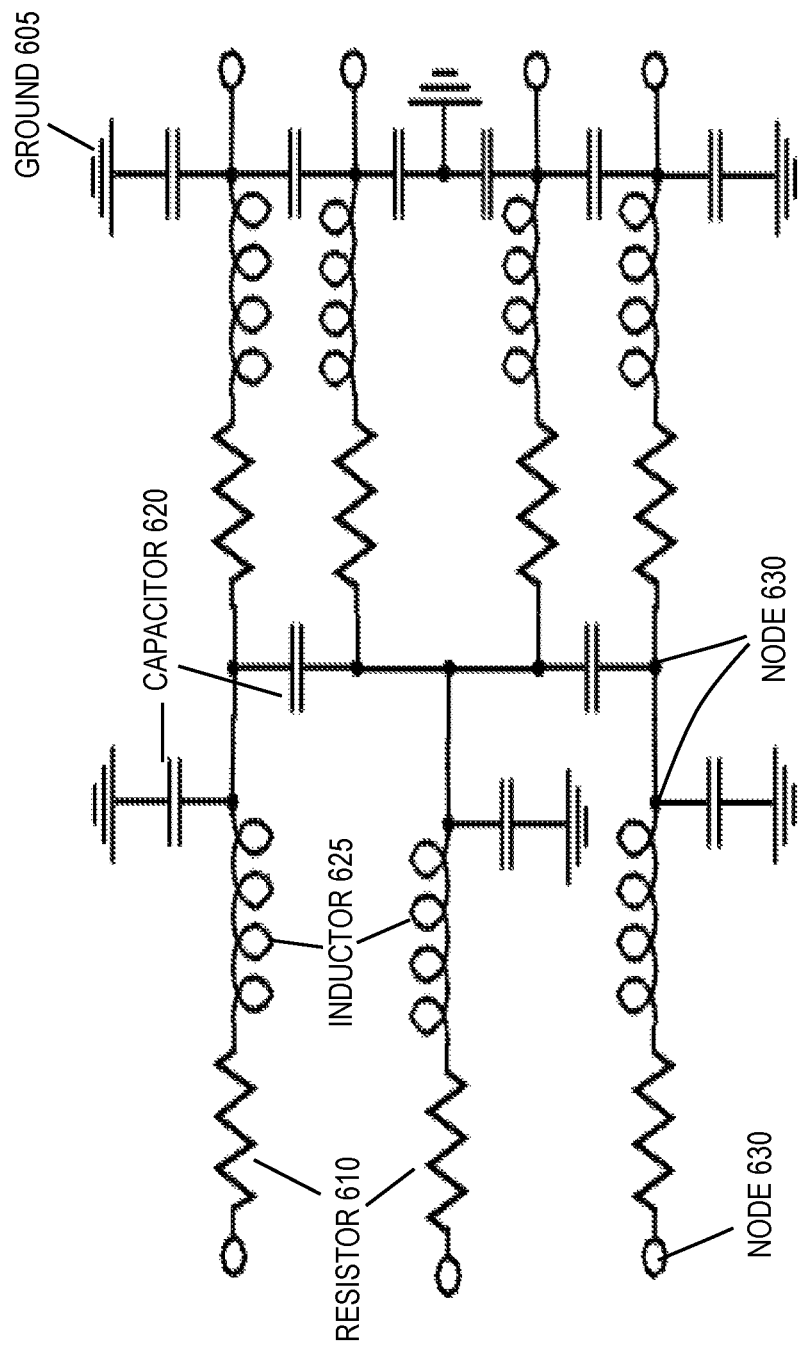
FIG. 6 depicts a distributed LCR element model of a wire transmission line in accordance with an embodiment.

FIG. 6 depicts a distributed LCR element model 600 of a wire transmission line according to an embodiment. Again for explanation purposes, an example is provided with respect to wafer 150_1 and its measured parameters 140_1, but applies by analogy to the remaining wafers 150_2 thorough 150_N and their respective measured parameters 140_1 through 140_N.

The distributed element model 600 may represent a portion of the wafer 150_1 that has been measured by the manufacturing fabrication plant 108, and the measured parameters 140_1 are transmitted by a server 144 to the computer system 100. As taken from the measured parameters 140_1, values for ground 605 (assuming the ground may not always be 0), values for resistors 610 (representing the resistance of the wire between any two nodes 630), values for capacitors 620 (representing a capacitance of the wire between any two nodes 630), and values for inductors 625 (representing an inductance of the wire between any two nodes 630) are assigned in the distributed element model 600. These assigned values in distributed element model 600 are used in the fault model 126 to generate the dynamic complex fault list 305 and dynamic complex fault patterns 310 to test the portion of the wafer 150_1 represented by the distributed element model 600.

Figure 4A:
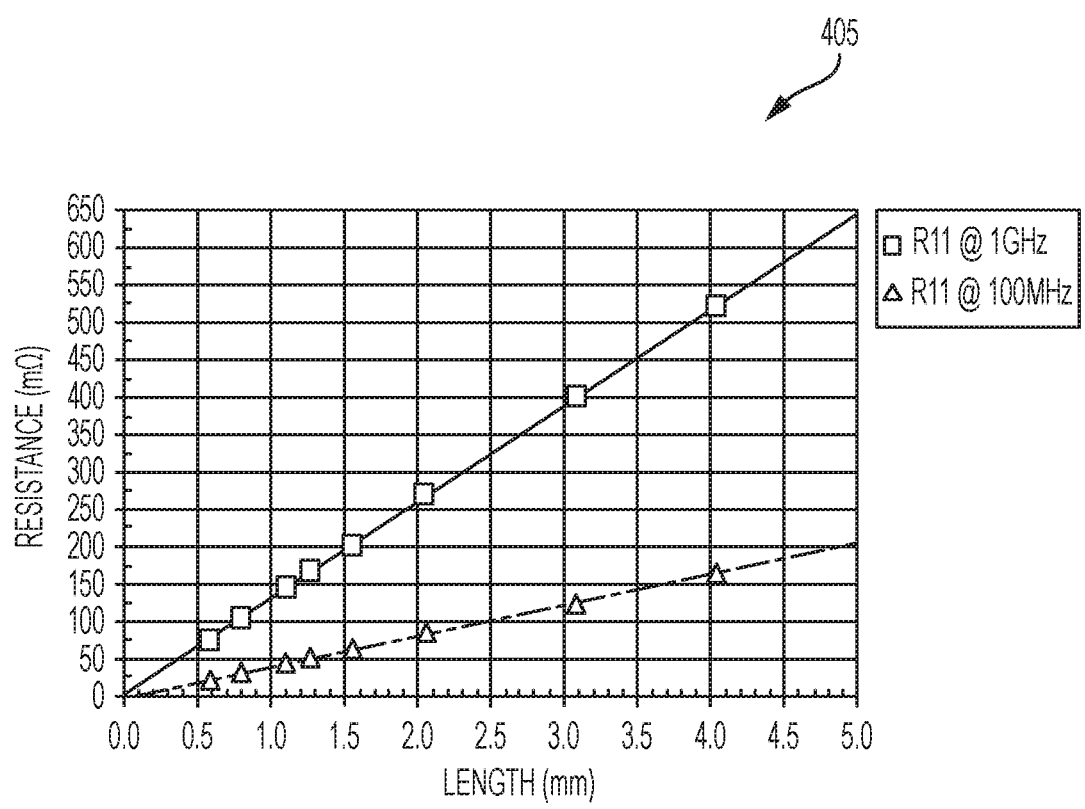
FIG. 4A depicts a graph of wire resistances for wires of various length.
Figure 4B:
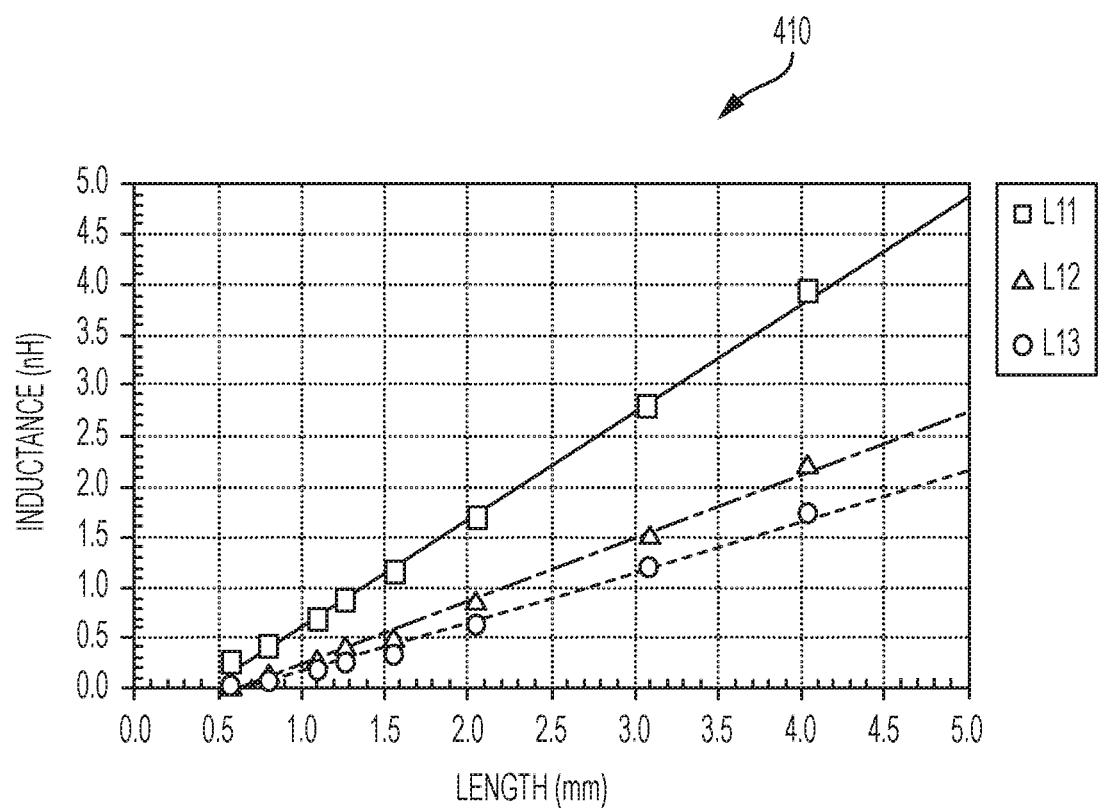
FIG. 4B depicts a graph of wire inductances for wires of various length.
Figure 4C:
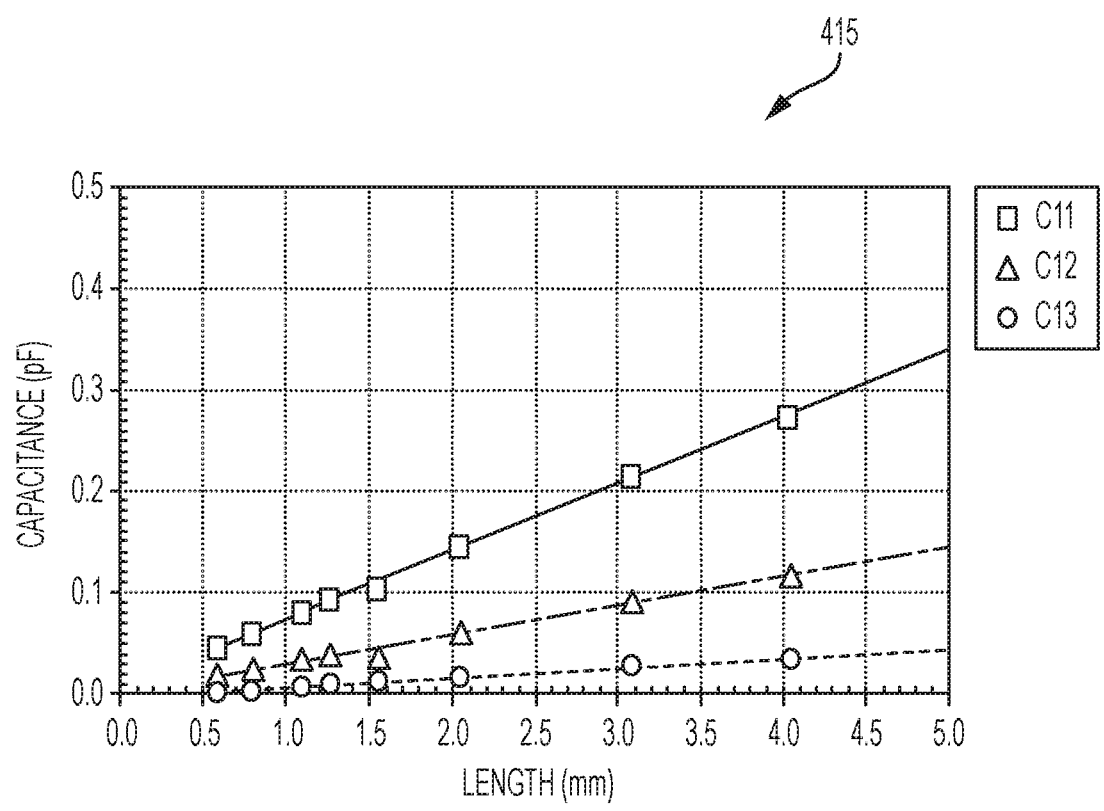
FIG. 4C depicts a graph of wire capacitances for wires of various length.

An example scenario is provided below to distinguish between utilizing a single actual value of an element obtained from the measured parameters 140 according to embodiments, as compared to using a range of expected values taken from graphs such as shown in FIGS. 4A, 4B, and 4C based on the length of a wire and type of metal.

Assume that an individual wire between two devices 505 (or between two nodes 630) on wafer 150_1 has an actual resistance of 5 ohms as measured by the manufacturing fabrication plant 108 but the expected resistance (taken from a wire resistance graph like FIG. 4A) is a range of 1, 2, 3 . . . 10 ohms that is used in the state-of-the-art. The state-of-the-art would have to generate a fault list and fault patterns for 1 ohm, run the test pattern to test the DUT, then generate a fault list and fault patterns for 2 ohms, run the test pattern to test the DUT, and so forth for this single wire until the entire range of expected values has been tested. This process repeats 10 times because the state-of-the-art does not know that the actual value of the wire is 5 ohms. However, embodiments only build a fault list and fault patterns for a resistance of 5 ohm once for the wafer 150_1 and run the test patterns (once) to test the device under test (DUT) 132 a single time. Running the test 10 times for a single wire in the state-of-the-art may not appear arduous. However, there may be millions of such wires (and sometimes billions of such wires on a state-of-the-art microprocessor) that need to be checked 10 times each for the range of expected values 1-10 ohms. Additionally, there is capacitance, inductance, and insulation layer dielectric thickness, which all need to be run in the test along with the resistance, and each of the capacitance, inductance, and insulation layer dielectric thickness has its own range of expected values (e.g., 10 expected values for each). Running all of the combinations of the individual ranges of expected values for resistance, capacitance, inductance, and insulation layer dielectric thickness of the wires becomes a fault model that is too large to be feasible in the state-of-the-art. Since the fault model would be too large, the state-of-the-art does not utilize every single combination, and therefore may not generate the actual defect that is generated when the actual (single) value of the resistance, capacitance, inductance, and insulation layer dielectric thickness are utilized from the measured parameters 140_1 in embodiments.

Also, there may be a case where the actual value of the resistance of the wire, e.g., 12 ohms in embodiments is outside the range of expected values 1-10 ohms (taken from a wire resistance graph for the type of wire such as in FIG. 4A) in the state-of-the-art. In this case, the state-of-the-art would not be able to cause the fault (to show up for identification) when testing the wafer 150_1 and then running simulations of the wafer 150_1. However, the embodiments are configured to cause the fault when testing the wafer 150_1 (as the DUT 133 in test system 130) because the actual value of the resistance of the wire in the measured parameters 140_1 is used and then cause the fault when running simulation of the wafer 150_1 (via the simulation software application 114).

FIG. 7 is a flow chart 700 of a computer implemented method for dynamic complex fault model generation for diagnostics simulation and pattern generation according to an embodiment.

At block 705, the processor 102 of the computer system 100 IS configured to receive inline fabrication parametric data 140, where the inline fabrication parametric data is a collection of physical measurements made on a device under test 132 during a manufacturing fabrication (by the manufacturing fabrication plant 108) of the device under test.

At block 710, the processor 102 is configured to generate a fault model 126 of defects according to the inline fabrication parametric data 140, where the fault model 126 is based on a physical design 118 of the device under test 132 combined with the inline fabrication parametric data for the device under test 132.

At block 715, the processor 102 is configured to generate test patterns 122 (e.g., via the test model software 124 which may include features of and/or be automated test pattern generation (ATPG) tool) based on the fault model 126 and the inline fabrication parametric data 140, such that the test patterns 122 are configured to test the device under test 132 in order to obtain test results 134 that are based on the inline fabrication parametric data.

At block 720, the processor 102 is configured to run a simulation 114 of the device under test 132 using the results 134 and the inline fabrication parametric data 140.

The inline fabrication parametric data 140 is utilized to create a dynamic complex fault list 305. The inline fabrication parametric data 140 is utilized to create dynamic complex fault patterns 310.

The simulation 114 generates complex fault localization data for the device under test, where the complex fault localization data identifies one or more locations of a defect in the device under test.

The inline fabrication parametric data 140 is received for the device under test from a manufacturing fabrication plant 108 that is building the device under test 132.

The inline fabrication parametric data 140 is received for the device under test as the collection of physical measurements made on the device under test during stages of building process layers of the device under test 132. The process layers form an integrated circuit on a wafer 150.

The device under test 132 corresponds to a wafer 150, where the wafer 150 has an integrated circuit built during the manufacturing fabrication, such that the inline fabrication parametric data apply to the wafer. Each one of wafers (e.g., wafer 150_2) has individual inline fabrication parametric data 140 (e.g., 140_2) measured during the manufacturing fabrication of the one of the wafers (to be utilized to generate the fault model 126 when the one of the wafers is tested as the device under test 132.

Technical effects and benefits include improved integrated circuits on a wafer. The improved integrated circuit improves a computer processor.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method for diagnostics simulation and pattern generation, the method comprising:
receiving, by a computer system, inline fabrication parametric data, wherein the inline fabrication parametric data is received for a device under test, wherein the inline fabrication parametric data is a collection of physical measurements associated with one or more components made on the device under test during stages of building process layers;
generating, by the computer system, test patterns based on the inline fabrication parametric data, such that the test patterns are configured to test the device under test in order to obtain results that are based on the inline fabrication parametric data; and
generating a fault model of defects comprising values according to the inline fabrication parametric data, the values of the fault model configured to be utilized in execution of the test patterns;
running, by the computer system, a simulation of the device under test using the results and the inline fabrication parametric data, to thereby detect a location of one or more defects in the device under test, wherein the location is configured to be provided to physical failure analysis for disassembly of the device under test.

2. The method of claim 1, wherein the fault model is based on a physical design of the device under test combined with the inline fabrication parametric data for the device under test.

3. The method of claim 2, wherein the test patterns are based on the fault model in addition to the inline fabrication parametric data.

4. The method of claim 1, wherein the inline fabrication parametric data is utilized to create a dynamic complex fault list.

5. The method of claim 1, wherein the inline fabrication parametric data is utilized to create a dynamic complex fault patterns.

6. The method of claim 1, wherein the simulation generates complex fault localization data for the device under test, the complex fault localization data identifying the location of the one or more defects in the device under test.

7. The method of claim 1, wherein the inline fabrication parametric data is received for the device under test from a manufacturing fabrication plant that is building the device under test.

8. The method of claim 7, wherein the process layers form an integrated circuit on a wafer.

9. The method of claim 1, wherein the device under test corresponds to a wafer, the wafer having an integrated circuit built during the manufacturing fabrication, such that the inline fabrication parametric data apply to the wafer.

10. The method of claim 9, wherein the inline fabrication parametric data is measured during the manufacturing fabrication of the wafer to be utilized to generate the fault model when the wafer is tested as the device under test.

11. A computer program product for diagnostics simulation and pattern generation, the computer program product comprising:
a computer readable storage medium having program instructions embodied therewith, the program instructions readable by a processing circuit to cause the processing circuit to perform a method comprising:
receiving, by the processing circuit, inline fabrication parametric data, wherein the inline fabrication parametric data is received for a device under test, wherein the inline fabrication parametric data is a collection of physical measurements associated with one or more components made on the device under test during stages of building process layers;
generating, by the processing circuit, test patterns based on the inline fabrication parametric data, such that the test patterns are configured to test the device under test in order to obtain results that are based on the inline fabrication parametric data;
generating a fault model of defects comprising values according to the inline fabrication parametric data, the values of the fault model configured to be utilized in execution of the test patterns;
running, by the processing circuit, a simulation of the device under test using the results and the inline fabrication parametric data, to thereby detect a location of one or more defects in the device under test, wherein the location is configured to be provided to physical failure analysis for disassembly of the device under test.

12. The computer program product of claim 11, wherein the fault model is based on a physical design of the device under test combined with the inline fabrication parametric data for the device under test.

13. The computer program product of claim 12, wherein the test patterns are based on the fault model in addition to the inline fabrication parametric data.

14. The computer program product of claim 13, wherein the inline fabrication parametric data is utilized to create a dynamic complex fault list.

15. The computer program product of claim 13, wherein the inline fabrication parametric data is utilized to create a dynamic complex fault patterns.

16. The computer program product of claim 13, wherein the simulation generates complex fault localization data for the device under test, the complex fault localization data identifying the location of the one or more defects in the device under test.

17. The computer program product of claim 13, wherein the inline fabrication parametric data is received for the device under test from a manufacturing fabrication plant that is building the device under test.

18. The computer program product of claim 13, wherein the process layers form an integrated circuit on a wafer.

19. A computer system for dynamic complex fault model generation for diagnostics simulation and pattern generation, the system comprising:

a memory; and a processor, communicatively coupled to the memory, the computer system configured to perform a method comprising:

receiving, by the processor, inline fabrication parametric data, wherein the inline fabrication parametric data is received for a device under test, wherein the inline fabrication parametric data is a collection of physical measurements made on the device under test during stages of building process layers of the device under test;

generating, by the processor, test patterns based on the inline fabrication parametric data, such that the test patterns are configured to test the device under test in order to obtain results that are based on the inline fabrication parametric data;

generating a fault model of defects comprising values according to the inline fabrication parametric data, the values of the fault model configured to be utilized in execution of the test patterns; and running, by the processor, a simulation of the device under test using the results and the inline fabrication parametric data, to thereby detect a location of one or more defects in the device under test, wherein the location is configured to be provided to physical failure analysis for disassembly of the device under test.

20. The system of claim 19, wherein the fault model is based on a physical design of the device under test combined with the inline fabrication parametric data for the device under test.

* * * * *